US010673204B2

(12) United States Patent
Pavlov et al.

(10) Patent No.: US 10,673,204 B2
(45) Date of Patent: Jun. 2, 2020

(54) LASER DRIVER

(71) Applicant: SensL Technologies Ltd., County Cork (IE)

(72) Inventors: Nikolay Pavlov, Cork (IE); Stephen Bellis, Cobh (IE); John Carlton Jackson, Cobh (IE)

(73) Assignee: SENSL TECHNOLOGIES LTD., County Cork (IE)

( * ) Notice: Subject to any disclaimer, the term of this patent is extended or adjusted under 35 U.S.C. 154(b) by 456 days.

(21) Appl. No.: 15/451,905

(22) Filed: Mar. 7, 2017

(65) Prior Publication Data

US 2018/0261975 A1 Sep. 13, 2018

(51) Int. Cl.
| | | |
|---|---|---|
| H01S 5/042 | (2006.01) | |
| H01S 5/068 | (2006.01) | |
| G01S 7/481 | (2006.01) | |
| G01S 7/484 | (2006.01) | |
| H01S 5/062 | (2006.01) | |
| H03K 5/04 | (2006.01) | |

(52) U.S. Cl.
CPC ............ *H01S 5/0428* (2013.01); *G01S 7/484* (2013.01); *G01S 7/4816* (2013.01); *H01S 5/06825* (2013.01); *G01S 7/4814* (2013.01); *H01S 5/06216* (2013.01); *H03K 5/04* (2013.01)

(58) Field of Classification Search
CPC ...... G01S 7/4814; G01S 7/4816; G01S 7/484; H01S 5/0428; H01S 5/06825; H01S 5/06216; H03K 5/04
USPC ...................................... 356/4.01
See application file for complete search history.

(56) References Cited

U.S. PATENT DOCUMENTS

| | | | | |
|---|---|---|---|---|
| 4,011,402 | A | * 3/1977 | Koike | .................. H04N 5/3692 326/97 |
| 5,787,103 | A | * 7/1998 | Coleman | ............ G06K 7/10851 372/29.015 |
| 6,469,357 | B1 | * 10/2002 | Hong | ..................... C23C 14/08 257/410 |
| 7,652,257 | B2 | 1/2010 | Li et al. | |
| 7,714,292 | B2 | 5/2010 | Agarwal et al. | |
| 8,003,948 | B2 | 8/2011 | Haselman et al. | |
| 9,029,772 | B2 | 5/2015 | Pavlov | |

(Continued)

FOREIGN PATENT DOCUMENTS

| | | |
|---|---|---|
| DE | 19546563 A1 | 6/1997 |
| DE | 10 2007 024 074 A1 | 11/2008 |

(Continued)

OTHER PUBLICATIONS

Davis, "SMD Inductor Values," 2011, downloaded Jun. 2, 2019 from http://www.interfacebus.com/Inductor_SMD_Values.html, 2 pp. (Year: 2011).*

(Continued)

*Primary Examiner* — Daniel L Murphy
(74) *Attorney, Agent, or Firm* — Polansky & Associates, P.L.L.C.

(57) ABSTRACT

A laser driver is described which comprises a resonant circuit having an inductor and a DC blocking capacitor. A biasing voltage reference is operably coupled to the inductor. A controller is operable for controlling the resonant circuit for selectively connecting the inductor between high and low impedance. The DC blocking capacitor is operable for connecting to a laser diode.

42 Claims, 19 Drawing Sheets

(56) References Cited

U.S. PATENT DOCUMENTS

| | | | |
|---|---|---|---|
| 2003/0024987 A1* | 2/2003 | Zhu | G02B 26/10 235/454 |
| 2004/0160996 A1 | 8/2004 | Giorgi | |
| 2004/0245592 A1 | 12/2004 | Harmon et al. | |
| 2008/0203309 A1 | 8/2008 | Frach et al. | |
| 2010/0102242 A1 | 4/2010 | Burr et al. | |
| 2010/0108900 A1 | 5/2010 | Burr et al. | |
| 2011/0108711 A1 | 5/2011 | Tsupryk et al. | |
| 2011/0248175 A1 | 10/2011 | Frach et al. | |
| 2011/0315856 A1 | 12/2011 | O'Mathuna et al. | |
| 2014/0312233 A1* | 10/2014 | Mark | G01J 1/46 250/341.8 |
| 2017/0031010 A1* | 2/2017 | Suzuki | G01S 7/4865 |

FOREIGN PATENT DOCUMENTS

| | | |
|---|---|---|
| GB | 2 451 678 A | 2/2009 |
| JP | 2008-287165 | 11/2008 |
| WO | 2010149593 | 12/2010 |

OTHER PUBLICATIONS

Davis, :Common Calacitor Values, 2015, downloaded Jun. 2, 2019 from http://www.interfacebus.com/Common_Capacitor_Values.html, 3 pp. (Year: 2015).*

Elextronic Stack Exchange, 2019, "Stack Exchange Network—Drain-Source Voltage," downloaded Jun. 3, 2019 from https://electronics.stackexchange.com/questions/195073/is-mosfet-gate-threshold-voltage-a-limit-or-minimal-full-on-switching-voltage, 18 pp. (Year: 2019).*

International Search Report and Written Opinion for International Application No. PCT/EP2018/055425, dated Jun. 22, 2018, 9 pages.

"Infineon IGT60R070D1 600V CoolGaN™ enhancement-mode Power Transistor"; Data Sheet; Rev. 2.1; Oct. 12, 2018; Infineon Technologies AG; 81726 München, Germany; 18 pages.

"FDMS86380_F085 N-Channel PowerTrench MOSFET"; Product Data Sheet; Rev. 1.0; Mar. 2016; Fairchild Semiconductor Corporation_Semiconductor Components Industries, LLC; 5005 East McDowell Road, Phoenix, AZ 85008, United States; 9 pages.

* cited by examiner

LASER DRIVER

FIELD OF THE INVENTION

The invention relates to a laser driver. In particularly but not exclusively the present disclosure relates to a short pulse laser driver for use in LiDAR applications.

BACKGROUND

Typical state-of-the art ToF LiDAR systems use either pulsed or continuous illumination. The latter uses a continuously time varying signal which can be represented as a sinusoidal signal. To detect the range of the target it is required to acquire the signal and determine any phase angle shift between the outgoing and the incoming signal. This shift is then used to calculate the distance from the source to the target.

Laser drivers for pulsed illumination LiDAR applications target pulse widths of greater than 4 ns. This relatively long pulse width limits the peak power that can be achieved due to eye safety concerns and increases range uncertainty. Also laser drivers known heretofore consume lots of power and require a high biasing voltage. In some prior art driver the required biasing voltage is in excess of 200 volts or more. This is undesireable.

There is therefore a need for a laser driver which addresses at least some of the drawbacks of the prior art.

SUMMARY

These and other features will be better understood with reference to the followings Figures which are provided to assist in an understanding of the present teaching. Accordingly, a laser driver is provided which comprises:
- a resonant circuit having an inductor and a DC blocking capacitor;
- a biasing voltage reference operably coupled to the inductor; and
- a controller operable for controlling the resonant circuit for selectively connecting the inductor between high and low impedance; wherein the DC blocking capacitor is operable for connecting to a laser diode.

In one aspect, the inductor is connected to the high impedance at least one of terminals of the inductor is connected to an open circuit.

In another aspect, when the inductor is connected to the low impedance at least one of terminals is shorted to ground.

In a further aspect, the controller is configured to repetitively switch the inductor between high and low impedance.

In an exemplary aspect, the inductor has a value in the range of 1 nH to 50 nH.

In a further aspect, the DC blocking capacitor has a value in the range of 10 pF to 1 nF.

In one aspect, an induced laser driver current is generated by the resonant circuit.

In another aspect, the induced lased driver current is a pulse signal.

In another exemplary aspect, the width of each pulse of the pulse signal is less than or equal to 1 ns.

In a further aspect, the width of each pulse of the pulse signal is in the range of 100 ps to 2 ns.

In one aspect, the DC blocking capacitor is operable for connecting to an anode of the laser diode.

In another aspect, the cathode of the laser diode is operably coupled to ground.

In a further aspect, the DC blocking capacitor is operable for connecting to a cathode of the laser diode.

In one aspect, the anode of the laser diode is operably coupled to ground.

In another aspect, the biasing voltage reference is operable to provide a positive bias voltage.

In one aspect, the positive bias voltage is in the range of 10V to 50V.

In a further aspect, the biasing voltage reference is operable to provide a negative bias voltage.

In an exemplary aspect, the controller comprises a switch.

In a further aspect, when the switch is closed a path is provided from the inductor to ground thereby connecting the inductor to low impedance.

In one aspect, when the switch is open the inductor is connected to high impedance.

In another aspect, when the switch is open a path to ground is isolated from the inductor.

In one aspect, a control voltage reference is provided which is operable for selectively opening and closing the switch.

In another aspect, the control voltage reference is operable to provide a pulsed voltage reference.

In a further aspect, the switch comprises a transistor.

In another aspect, the biasing voltage reference biases the inductor with a voltage level in the range of 10V to 50V.

In one aspect, an induced EMF voltage is generated across the inductor.

In a further aspect, the induced EMF voltage opposes the biasing voltage reference until a steady state DC voltage value is reached.

In another aspect, the controller repetitively cycles the switch between open and closed states.

In one aspect, the time period of the open state in the cycle is ≥10 nanoseconds.

In another aspect, the time period of the closed state in the cycle is 10 to 100 nanoseconds.

In a further aspect, the time period of the open and closed states is substantially equal.

In another aspect, the controller is configured to apply a pulsed drive signal to the switch for controlling thereof.

In one aspect, when the switch is closed a DC current that was flowing through the inductor is unable to stop abruptly thereby generating a back EMF across the inductor and an induced current generated by the back EMF is diverted through DC current blocking capacitor C1 and the laser diode.

In a further aspect, the resonant circuit resonates at a frequency $1/(2\pi(LC)^{1/2})$ which determines a pulse width of the induced current pulse injected into the laser diode.

In an exemplary aspect, the pulse width of the induced current is tuned by appropriate selection of the inductor and DC blocking capacitor values.

In a further aspect, a protection diode is provided which is operable for protecting the laser diode against reverse polarity when the resonant circuit is resonating.

In another aspect, the transistor is a Gallium Nitride transistor.

In a further aspect, the controller comprises a MOSFET driver.

In one aspect, the MOSFET driver is operable to drive the Gallium Nitride transistor with a pulse signal having positive and negative components.

In a further aspect, the maximum value of the pulse signal corresponds to the maximum gate source voltage range of the Gallium Nitride transistor.

In one aspect, the pulse signal is in the range of −6V to +6V.

In a further aspect, the pulse signal has a short duty cycle.

In another aspect, the short duty cycle is 10 ns to 100 ns at 10 KHz to 200 MHz.

In one aspect, the maximum reverse gate source voltage of the transistor corresponds to a Gate Source junction value when the transistor is driven into depletion causing the drain source current to turn off abruptly.

In an exemplary aspect, energy stored on the inductor then gets passed as a sharp current pulse through the DC blocking capacitor and delivered to the laser diode.

The present disclosure also relates to a LiDAR device comprising a laser driver comprising a resonant circuit having an inductor and a DC blocking capacitor;

a biasing voltage reference operably coupled to the inductor; and a controller operable for controlling the resonant circuit for selectively connecting the inductor between high and low impedance; wherein the DC blocking capacitor is operable for connecting to a laser diode;

a laser operably coupled to the laser driver; and an optical detector.

In one aspect, an optical detector comprises a Geiger mode detector.

In a further aspect, the optical detector comprises an SiPM detector.

In another aspect, the optical detector comprises a single photon avalanche diode (SPAD).

BRIEF DESCRIPTION OF THE DRAWINGS

The present teaching will now be described with reference to the accompanying drawings in which.

DETAILED DESCRIPTION

Figure 1:
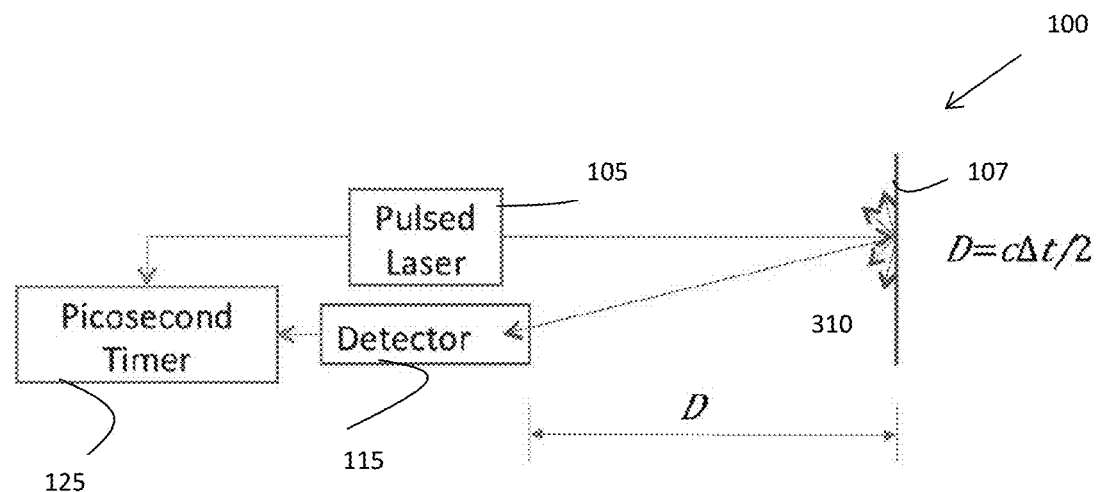
FIG. 1 illustrates an exemplary technique for a direct ToF ranging.

The present disclosure will now be described with reference to an exemplary laser driver. It will be understood that the exemplary laser driver is provided to assist in an understanding of the teaching and is not to be construed as limiting in any fashion.

Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

LiDAR is a ranging technique that is increasingly being employed in applications such as mobile range finding, automotive ADAS (Advanced Driver Assistance Systems), gesture recognition and 3D mapping. Employing a Geiger mode detector such as a SiPM sensor has a number of advantages over alternative sensor technologies such as avalanche photodiode (APD), PIN diodes and photomultiplier tubes (PMT) particularly for mobile and high volume products. The basic components typically used for a direct ToF ranging system 100, are illustrated in FIG. 1. In the direct ToF technique, a periodic laser pulse 105 is directed at the target 107. The target 107 diffuses and reflects the laser photons and some of the photons are reflected back towards an optical detector 115. The detector 115 converts the detected laser photons (and some detected photons due to noise) to electrical signals that are then timestamped by timing electronics 125.

This time of flight, t, may be used to calculate the distance, D, to the target from the equation $$D = c\Delta t/2, \qquad \text{Equation 1}$$

where c=speed of light; and

Δt=time of flight.

The detector 115 must discriminate returned laser photons from the noise (ambient light). At least one timestamp is captured per laser pulse. This is known as a single-shot measurement. The signal to noise ratio may be significantly improved when the data from many singleshot measurements are combined to produce a ranging measurement from which the timing of the detected laser pulses can be extracted with high precision and accuracy.

Figure 2:
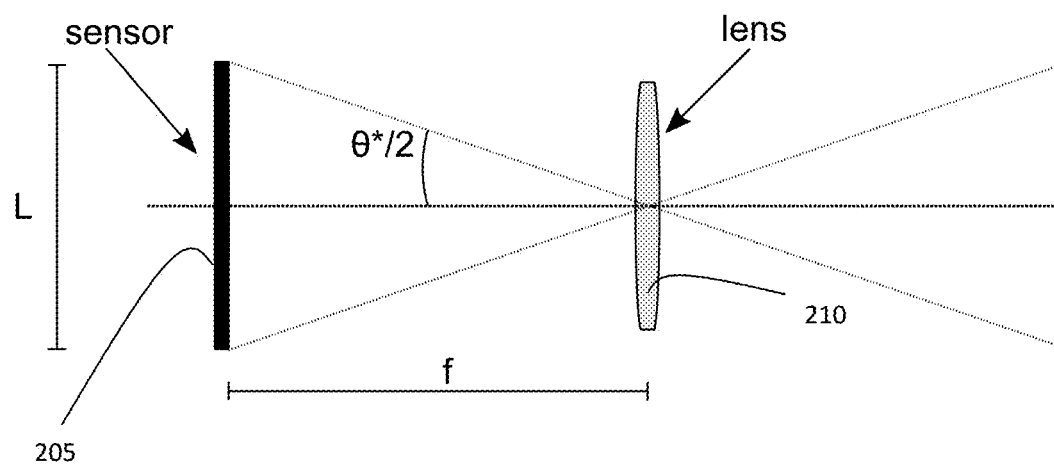
FIG. 2 illustrates an exemplary ToF ranging system.

Referring now to FIG. 2 which shows an exemplary LiDAR apparatus 200 which incorporates a Silicon Photomultiplier (SiPM) 205 which comprises an array of Single Photon Avalanche Photodiodes (SPAD) which operates as an optical detector. A lens 210 may be used to provide corrective optics. For a given focal length f of a lens system, the angle of view θ of a sensor placed on the focal point and with length L is given by:

$$\theta_{x,y} = 2 \times \operatorname{atan}\left(\frac{L_{x,y}/2}{f}\right) \quad \text{Equation 2}$$

Where:
f is the focal length of receiver lens:
$L_x$, $L_y$ is sensor horizontal and vertical length; and
$\theta_{x,y}$ is the SiPM detector angle of view.

Figure 3:
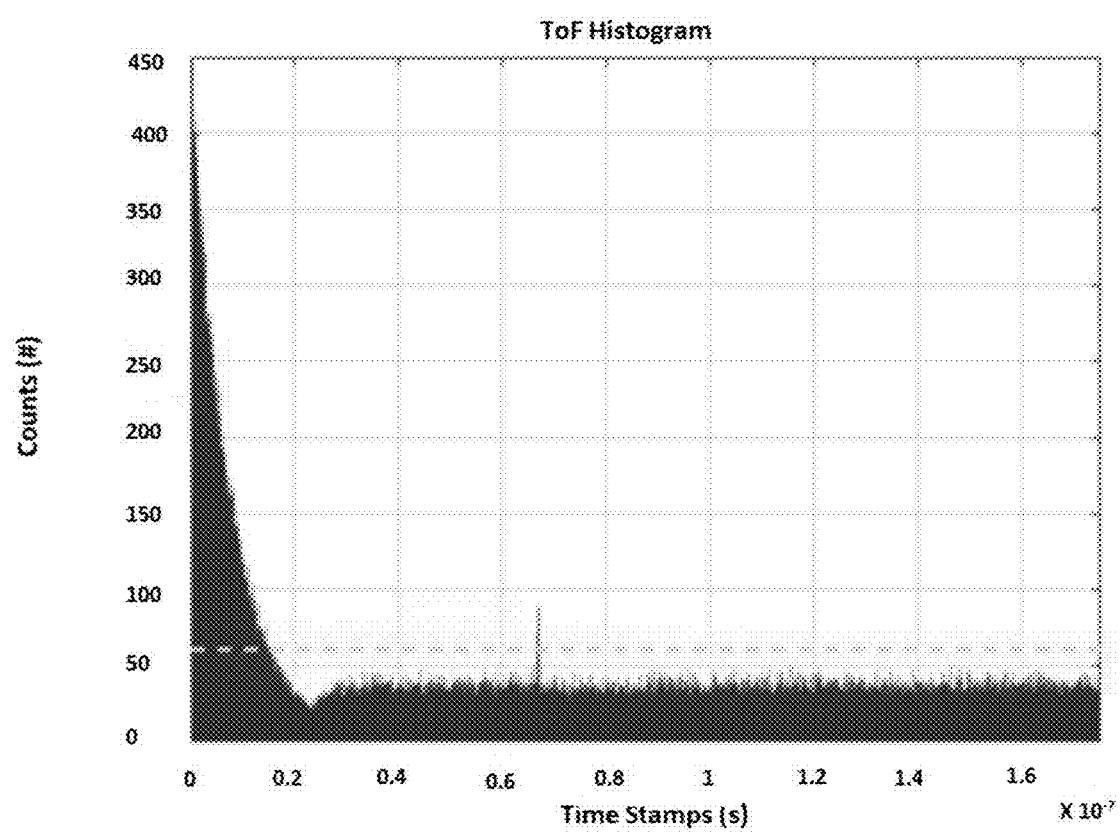
FIG. 3 illustrates an histogram generated using the ToF ranging system of FIG. 4.

This means that a large sensor has a large angle of view when a short focal length is used. When the lens aperture is widened, more ambient photons are detected while the number of returned laser photons remains constant. The SiPM 205 is prone to saturation as is evident from the large overshoot at the start of the histogram window in FIG. 3. When the SiPM 205 is saturated the laser photons can no longer be detected, leading to a lower signal detection rate and lower overall $SNR_H$.

Figure 4:
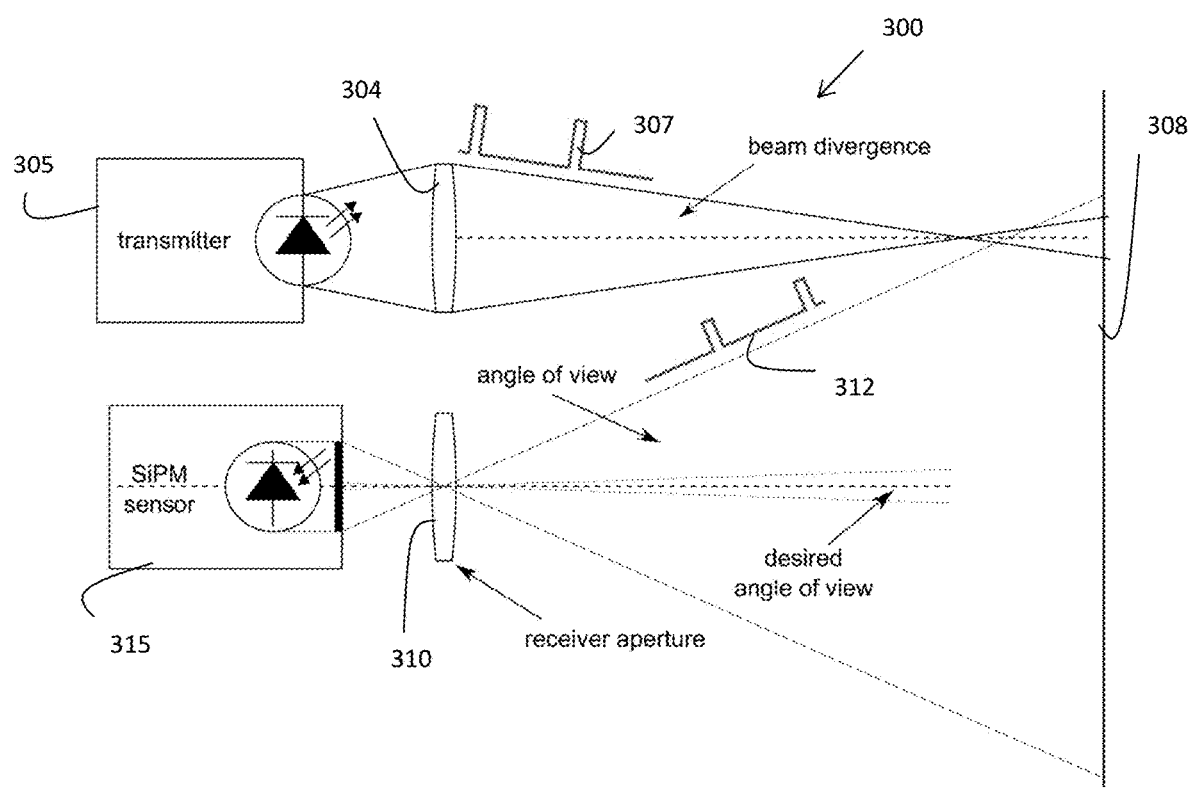
FIG. 4 illustrates an exemplary LiDAR apparatus incorporating an SiPM detector.

FIG. 4 illustrates an exemplary LiDAR system 300 which includes a laser source 305 for transmitting a periodic laser pulse 307 through a transmit lens 304. A target 308 diffuses and reflects laser photons 312 through a receive lens 310 and some of the photons are reflected back towards a SiPM sensor 315. The SiPM sensor 315 converts the detected laser photons and some detected photons due to noise to electrical signals that are then timestamped by timing electronics SPAD/SiPMs sensors suffer from limited dynamic range due to a necessary recovery/recharge process of the sensors. At every photo detection in a microcell of the SiPM, the avalanche process needs to be quenched through, for example, a resistor which discharges the photocurrent and brings the diode out of the breakdown region. Then a recharge, passive or active, process begins to restore the diode bias voltage restoring the initial conditions ready for the next photo detection. The amount of time during which the quenching and recharge process take place is commonly referred to as dead time or recovery time. No further detections can happen in this time window due to the bias condition of the diode being outside the Geiger mode. In a SiPM, when a microcell enters the dead time window, the other microcells can still detect photons. Hence, the number of microcells define the photon dynamic range of the sensor allowing higher number of photons per unit time to be detected. When no microcells are available for detection due to dead time, the SiPM is said to be in its saturation region. A high number of diodes within a SiPM (microcells) is necessary to compensate the recovery process which inhibits the involved units of the detector. SiPM detectors suffer from saturation in high ambient light conditions due to detector dead time.

Figure 5:
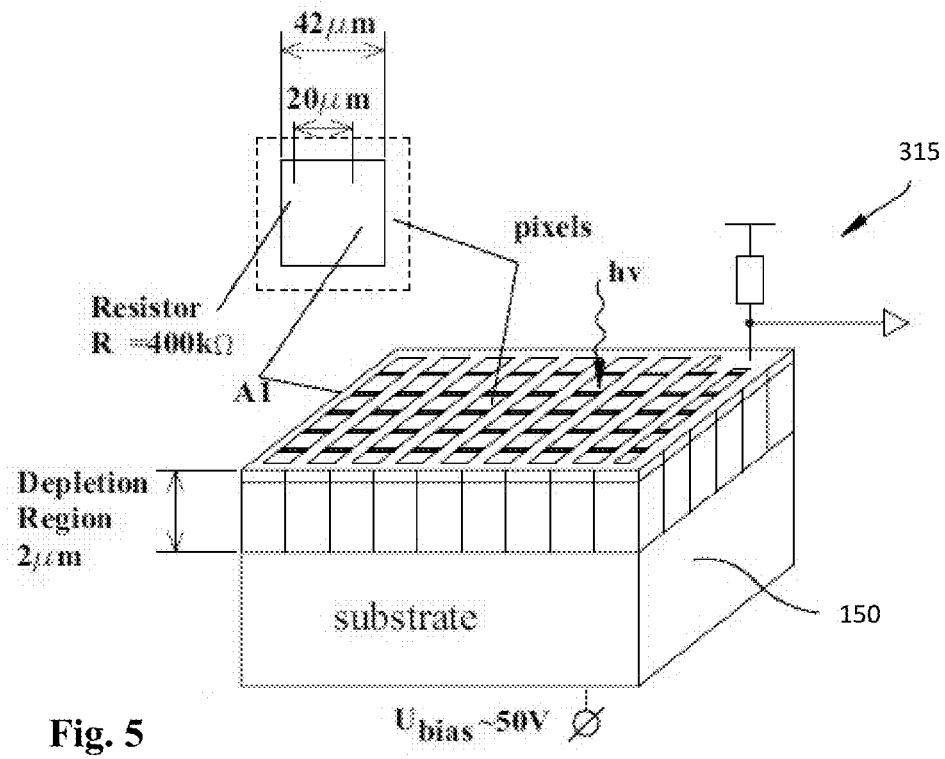
FIG. 5 illustrates an exemplary structure of a silicon photomultiplier (SiPM).
Figure 6:
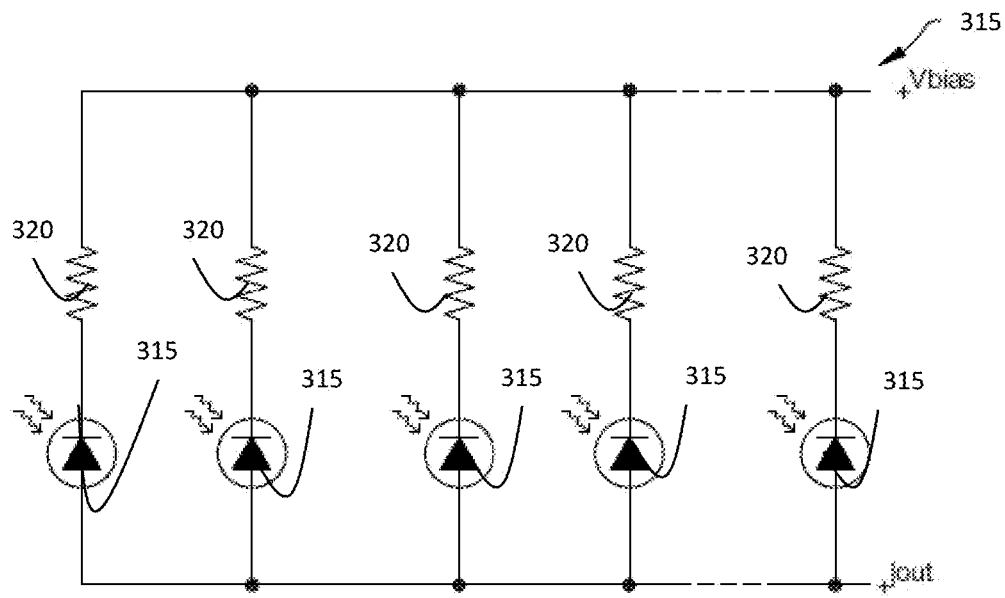
FIG. 6 is a schematic circuit diagram of an exemplary silicon photomultiplier.

The operation of the SiPM sensor 315 is described with reference to FIGS. 5 and 6. The SiPM sensor 315 comprising an array of Geiger mode photodiodes 315. As illustrated, a quench resistor 320 is provided adjacent to each photodiode 315 which may be used to limit the avalanche current. The photodiodes 315 are electrically connected to common biasing and ground electrodes by aluminium or similar conductive tracking. A schematic circuit is shown in FIG. 6 in which the anodes of an array of photodiodes 315 are connected to a common ground electrode and the cathodes of the array are connected via current limiting quench resistors 320 to a common bias electrode for applying a bias voltage across the diodes. The SiPM 315 may be used as a Geiger mode detector in accordance with the present teaching. It is not intended to limit the present teaching to the exemplary Geiger mode detector described in the exemplary embodiment as other Geiger mode detectors may be utilised such as single-photon avalanche diodes (SPADs) or the like.

The SiPM sensor 315 integrates a dense array of small, electrically and optically isolated Geigermode photodiodes 315. Each photodiode 315 is coupled in series to a quench resistor 320. Each photodiode 315 is referred to as a microcell. The number of microcells typically number between 100 and 3000 per mm$^2$. The signals of all microcells are then summed to form the output of the SiPM 315. Each microcell detects photons identically and independently. The sum of the discharge currents from each of these individual binary detectors combines to form a quasi-analog output, and is thus capable of giving information on the magnitude of an incident photon flux.

Each microcell generates a highly uniform and quantized amount of charge every time the microcell undergoes a Geiger breakdown. The gain of a microcell (and hence the detector) is defined as the ratio of the output charge to the charge on an electron. The output charge can be calculated from the over-voltage and the microcell capacitance.

$$G = \frac{C \cdot \Delta V}{q}$$

Where:
G is the gain of the microcell;
C is the capacitance of the microcell;
ΔV is the over-voltage; and
q is the charge of an electron.

Figure 7:
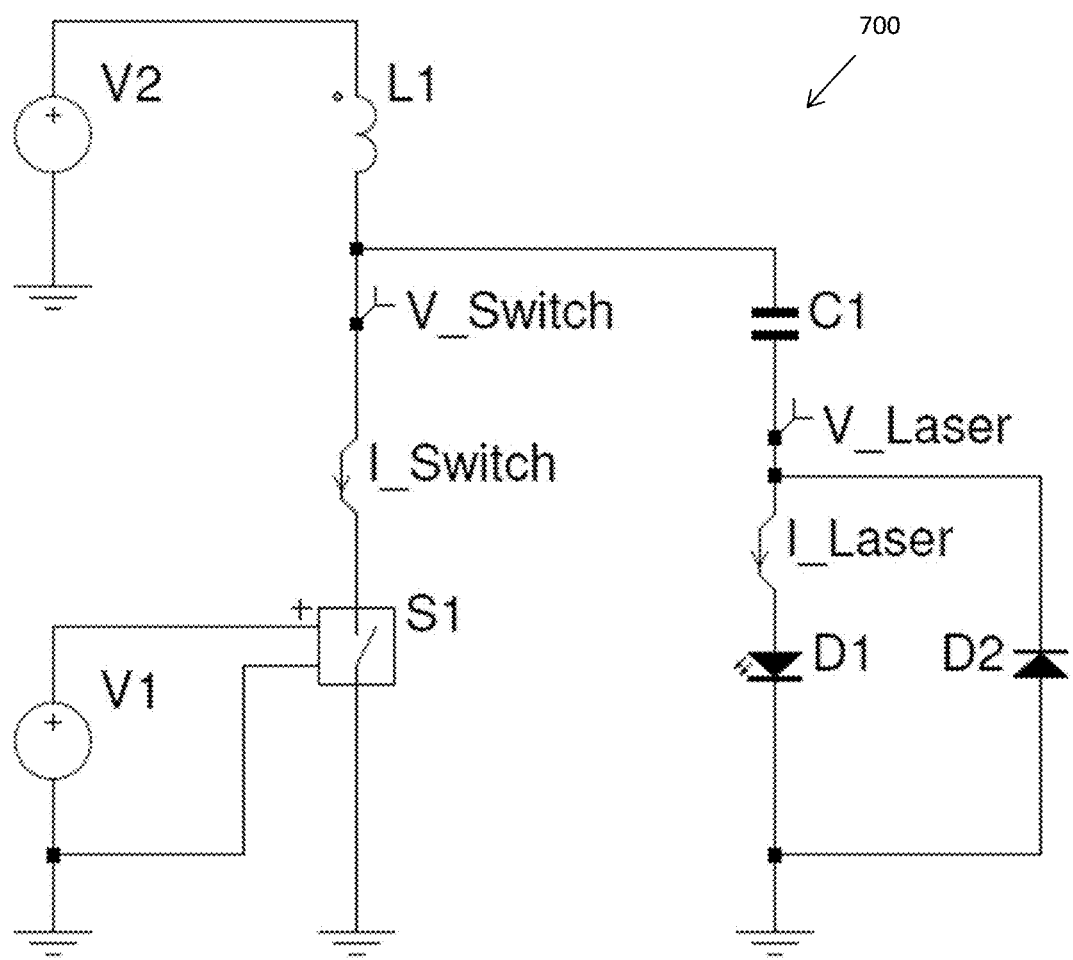
FIG. 7 is a schematic circuit diagram of a laser driver in accordance with the present teaching.

Referring to FIG. 7 there is illustrated an exemplary laser driver circuit 700 which is particularly suitable for LiDAR applications in view of its short output pulses. A voltage source V1 applies a short pulse of the order of nanoseconds to close a switch S1 which is normally open. Ideally the rising and falling edges of voltage source V1 have infinite slew rate to instantaneously turn on switch S1. When switch S1 closes then a voltage V2 which in the exemplary embodiment may be in the range of 10V to 50V is applied to inductor L1. The current through L1 cannot change instantaneously because for this to occur, the current would need to change by a finite amount in zero time. The rate of current change di/dt would need to be infinite consequently making an induced EMF infinite as well. Infinite voltages do not exist. As a consequence, a self-induced EMF is generated across inductor L1 and is determined by Faraday's equation:

$$VL = -Ldi/dt.$$

The self-induced EMF opposes the applied voltage V2 until the current reaches a steady state DC value. Since inductors and switches are never perfect and always have some level of resistance a DC current is generated by the applied voltage, the resistance of L1 and the resistance of the closed switch.

After a time period has elapsed which in the exemplary arrangement is a number nanoseconds switch S1 is opened and a path to ground through switch S1 becomes high impedance. The DC current that was flowing through inductor L1 cannot stop abruptly so a back EMF is generated across L1 and the current gets diverted through a DC current blocking capacitor C1 and a laser diode D1. Inductor L1 and capacitor C1 form a resonant circuit at frequency $1/(2\pi(LC)^{1/2})$ which has a bearing on the pulse width of the current pulse injected into the laser diode D1 via the DC blocking capacitor C1. Appropriate selection of values for the inductor L1 and the capacitor C1 allows the pulse width to be tuned to achieve the desired width. The generated DC current provides a drive current to the laser diode D1.

It will be appreciated by those skilled in the art that in laser diodes the output pulse width of the laser beam is not necessarily equal to the drive current pulse width. Diode D2 protects the laser diode against reverse polarity as the LC circuit resonates, damping out the negative going voltages induced by the resonant circuit. In an ideal LC circuit the energy would be continuously cycled between L1 and C1.

Figure 8:
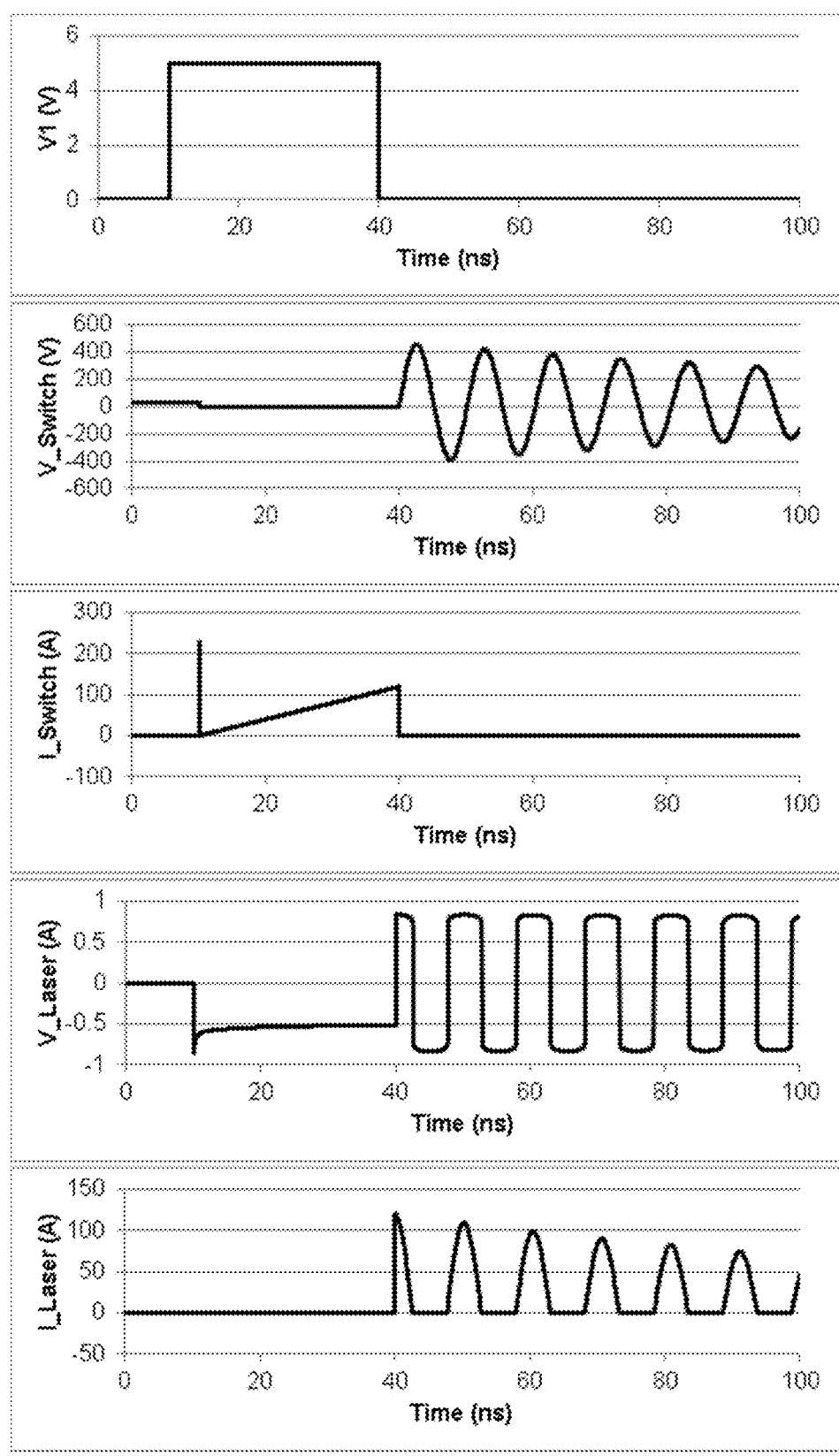
FIG. 8 illustrates simulated signal diagrams using the laser driver of FIG. 7.

Referring to the exemplary timing diagram of FIG. 8 which are provided by way of example only and it is not intended limit the present teaching to the exemplary graphs provided. The timing diagram of FIG. 8 is generated using the laser driver circuit 700 using ideal diodes for laser diode D1 and protection diode D2, ideal capacitor C1 with low equivalent series resistance (ESR) and L1. At t=10 ns the source V1 goes to 5V to close the switch S1. When S1 closes the back EMF is generated in L1 and V_Switch is grounded from its initial condition at V2 bias voltage. A first probe I_Switch is provided for measuring the current through the switch S1. A second probe V_Switch is provided for measuring the voltage across the switch S1. A third probe V_Laser is provided for measuring the voltage across the laser diode D1. A fourth probe I_Laser is provided for measuring the generated DC current which drives the laser diode D1. The voltage across capacitor C1 cannot immediately change so the voltage V_Laser also drop by the V2 voltage value. This then puts a forward bias on the protection diode D2 and a current pulse is transmitted through C1 and S1. The coil of the inductor L1 then starts charging as can be seen in the current ramp on I_Switch from 10 to 40 ns. When the voltage V1 causes the switch S1 to open again the current through the coil L1 cannot stop immediately. The energy then gets transferred to the capacitor as induced back EMF and the LC circuit formed by L1 and C1 starts to resonate delivering current pulses to the laser diode D1 and protection diode D2.

The amplitude of the resonance seen by the oscillations of the signal measured by probe V-Switch is damped over time by the energy lost in the equivalent series resistance (ESR) of the capacitor C1. There may be more energy losses in the circuit due to non-ideal components. The inductor L1 and switch S1 will have some resistance and diode D2 will dissipate some power through heat loss. The laser will also be a non-ideal in reality and aim is to tune the circuit so that the laser to dissipate most of the energy to produce light and heat in the first period of oscillation in order to damp out the oscillations.

Figure 9:
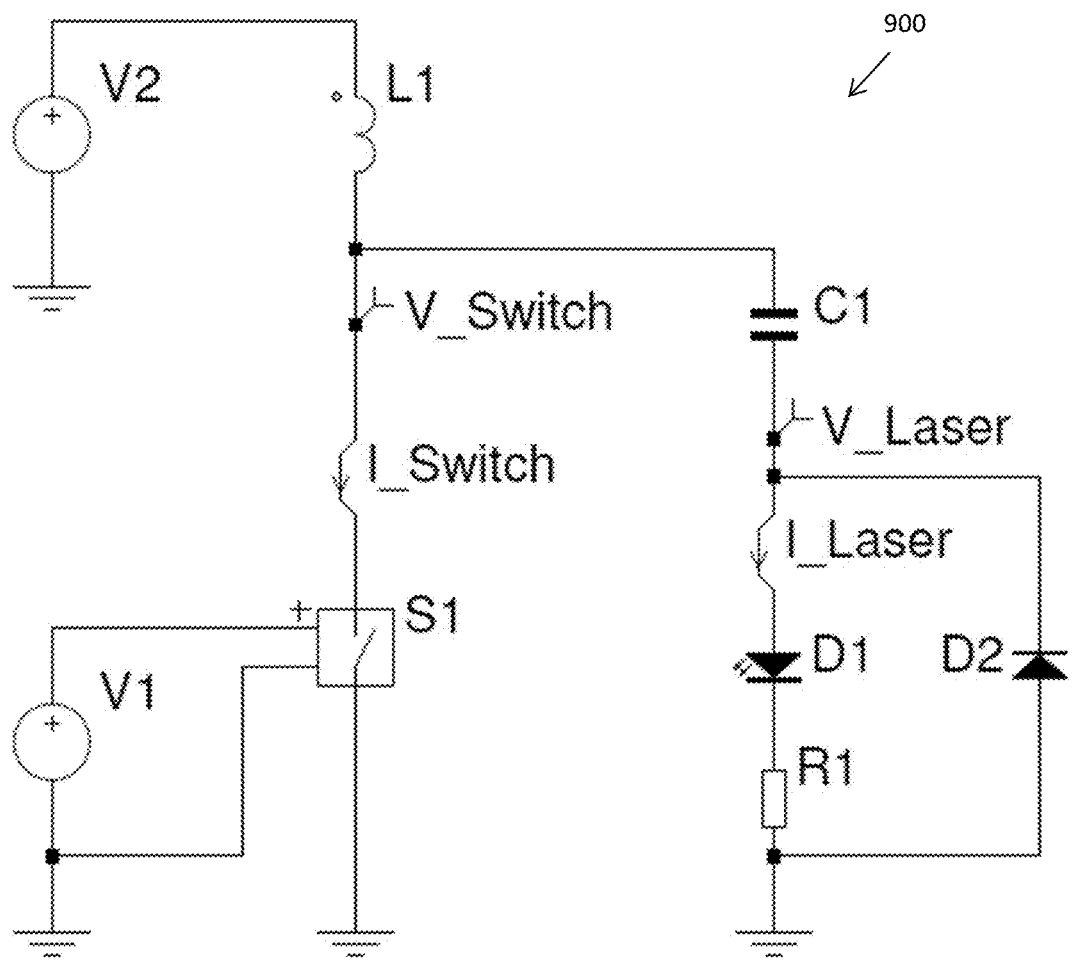
FIG. 9 is a schematic circuit diagram of another laser driver which is also in accordance with the present teaching.
Figure 10:
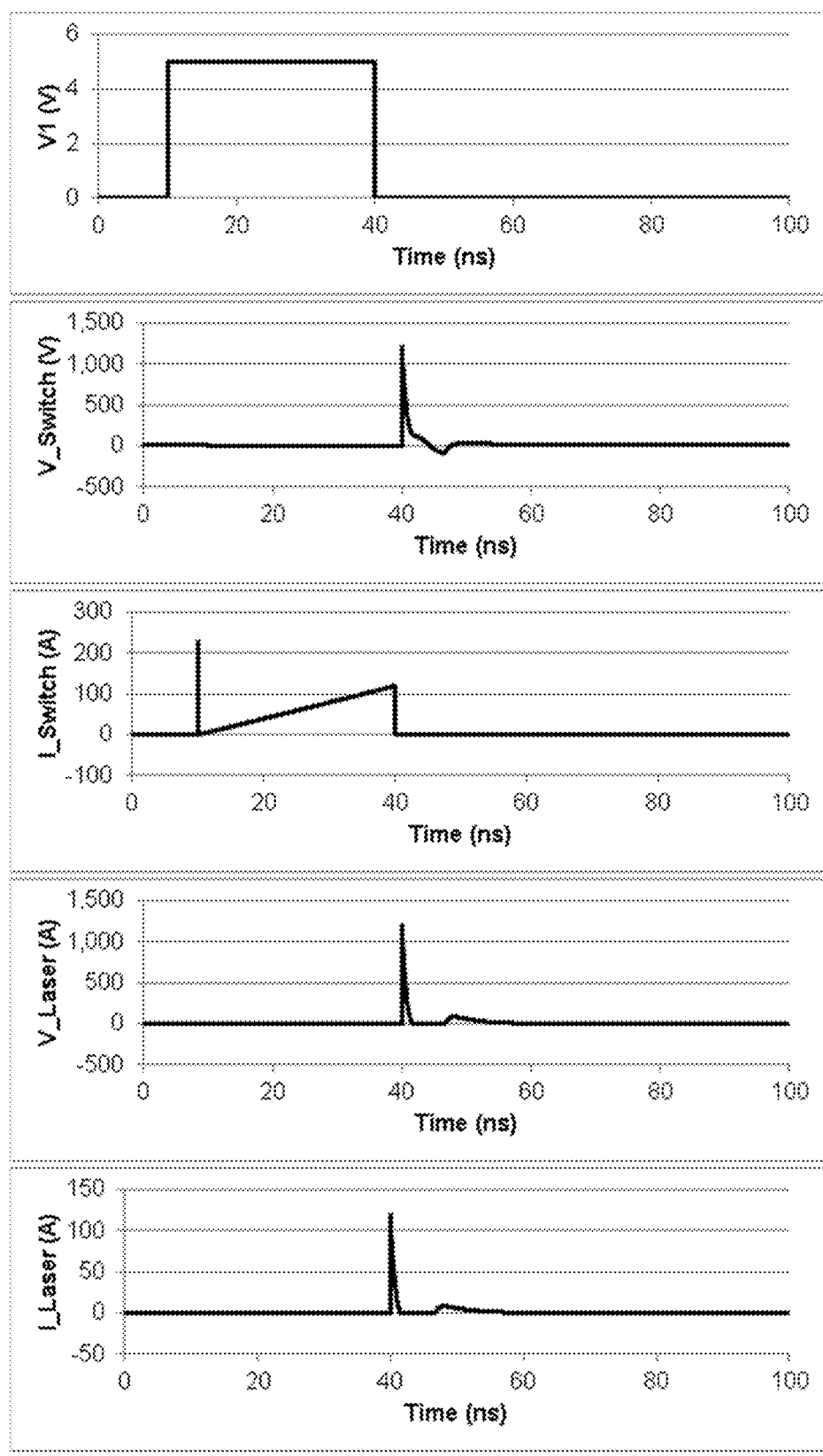
FIG. 10 illustrates a laser pulse width diagram generated using the laser driver of FIG. 9.

Referring to FIG. 9 there is illustrated another LiDAR apparatus 900 which is also in accordance with the present teaching. The LiDAR apparatus 900 is substantially similar to the LiDAR apparatus 700 and like components have corresponding labels. The laser diode D1 in LiDAR apparatus 900 is modelled with a series resistance of 10Ω to mimic the power dissipation of the laser. The waveforms as illustrated in FIG. 10 show that the oscillations are now quickly damped by the power dissipation in R1 which crudely models the effect of conversion of the energy to light and heat in the laser diode D1. The value of the peak current is high while the width of the pulse is of the order of a nanosecond.

Figure 11:
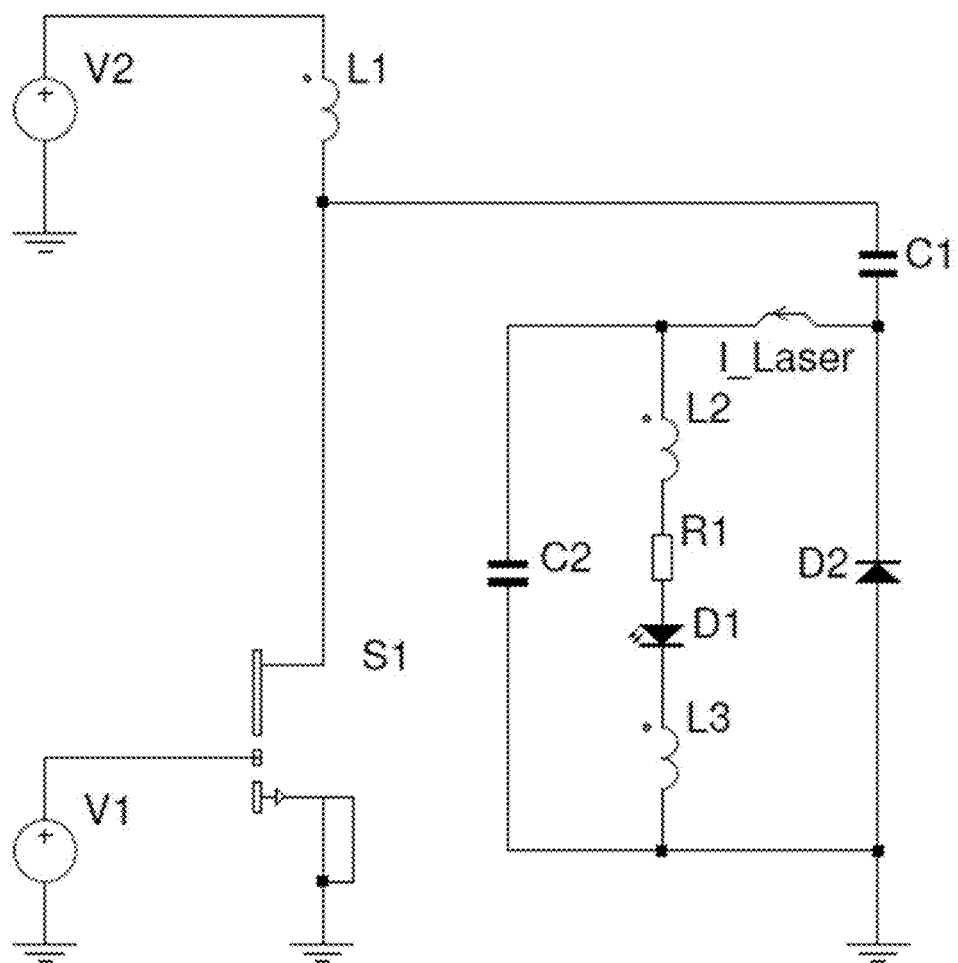
FIG. 11 illustrates another LiDAR apparatus which is also in accordance with the present teaching.
Figure 12:
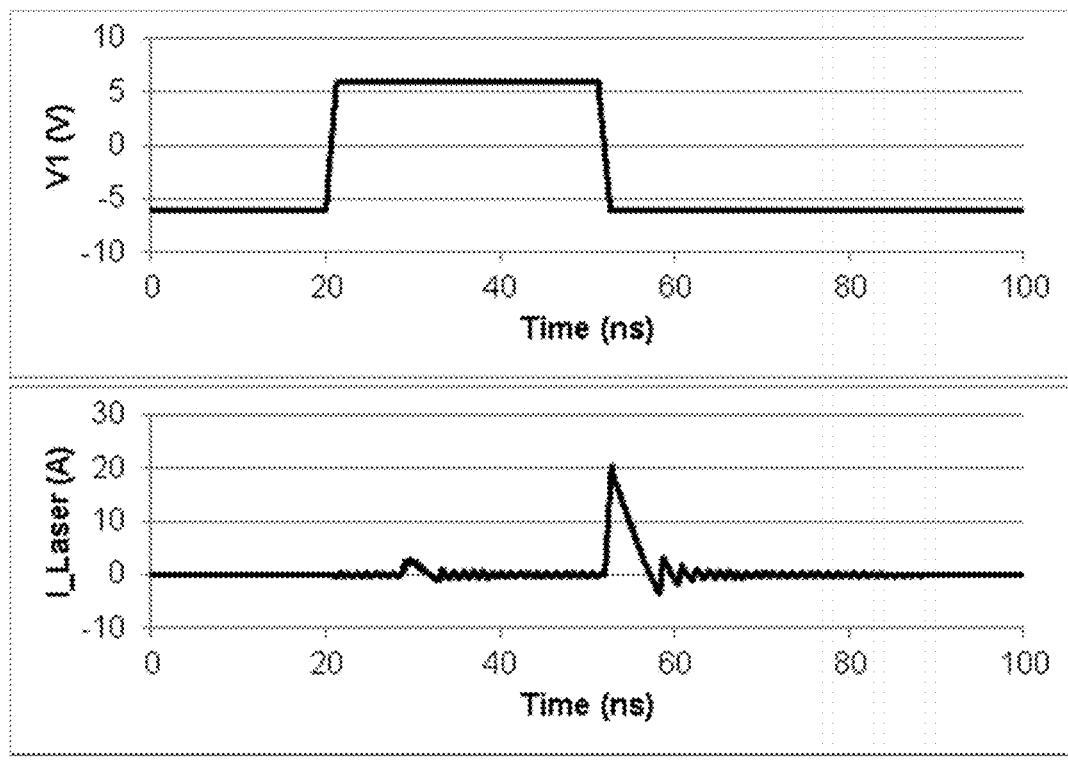
FIG. 12 illustrates a laser pulse width diagram using the LiDAR apparatus of FIG. 11.

Referring to FIG. 11 which is a SPICE model of a laser driver circuit based on commercially off the shelf components for S1, L1, C1 and D2. The packaging for the laser is also included in the model with L2 and L3 representing the inductance of the anode and cathode wirebonds respectively, C2 the parallel capacitance of the package and R1 the serial resistance. The I_laser simulation curves from the model are shown in FIG. 12. The rise and fall times of pulse source V1 are modelled on a high speed MOSFET gate driver such as the Intersil ISL55110 which has rise and fall times of 1.2 ns and 1.4 ns respectively. Ideally these times would be zero time length but the most practical solution to minimize the rise and fall time is to use a gate driver.

Figure 13:
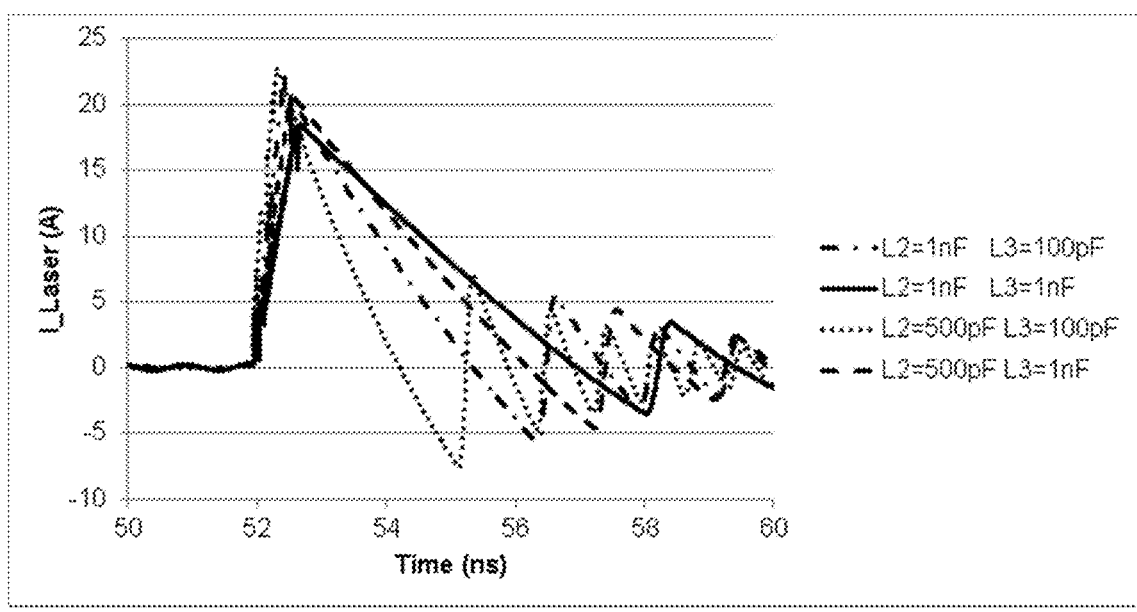
FIG. 13 illustrates a laser pulse width diagram using the LiDAR apparatus of FIG. 11 for different values for the inductor L1.

To obtain fast charging of the coil L1 the transistor should be able handle high current density and have low on resistance. Fast switch off is also advantageous to maximize the peak current which will flow through the laser diode D1. In the exemplary arrangement, the switch S1 may be provided by a fast Gallium Nitride (GaN) transistor which is driven by a MOSFET gate driver which drives the Gallium Nitride (GaN) transistor S1 (GaN Systems GS66502B used in the model) with a positive and negative pulse (eg ±6V) of short duty cycle (eg 10 ns to 100 ns at 10 KHz to 200 MHz.). GaN transistors are preferred over silicon power devices which are reaching their limit of speed, temperature and power. The advantages GaN transistors over silicon are due to the material offering higher electrical breakdown characteristics, three times the bandgap, and high carrier mobility. The material and electronic properties of GaN transistor offer a number of advantages over high power silicon alternatives:

high dielectric strength
high operating temperature
high current density
high speed switching
low on-resistance When the gate source voltage of Vgs of S1 goes positive current gets drawn from inductor L1 in the drain source path of S1 to GND. L1 is biased by supply V2 (15 to 40V) and stores energy over the duration of the positive going V1 pulse with the current through L1 gradually increasing. When the gate of S1 is driven negative to −6V the transistor Gate Source junction is driven into depletion causing the drain source current to turn off very quickly. The energy stored on L1 then gets passed as a sharp current pulse through capacitor C1 and delivered to the laser diode as laser driver current. The simulation in FIG. 13 shows that a high peak current (order of 15 A) pulse is obtained over the period of a few nanoseconds.

Diode D2 stops build up of a negative bias across the laser diode D1 since laser diodes would typically have a maximum reverse voltage of a few volts. Typical characteristics of D3 may include low reverse current, low series resistance and fast switching. An RF PIN diode has been found to be a suitable choice.

For the laser model shown in FIGS. 11 L2 and L3 represent the inductance of the laser package wire bonds. Values of 1 nF were used for the simulation in FIG. 12 representing the inductance of short leads in a TO18 or plastic packaged part. Using chip on board techniques or other state of the art packaging techniques the inductance of the packaging can be reduced. Multiple wire bonds could be used on the anode side and the substrate cathode contact of the laser could be connected directly to the PCB ground plane via a copper tungsten (CuW) substrate to minimise the package inductance. The effects of reducing the package inductance are shown in the simulations of FIG. 13. The pulse width of the drive current decreases and there is a slight increase in the peak current. In SiPM based imaging LiDAR range finding applications it is desirable to have high peak current and small laser pulse width. This maximises the number of return photons and minimises range uncertainty for low reflectance targets at long distances.

Figure 14A:
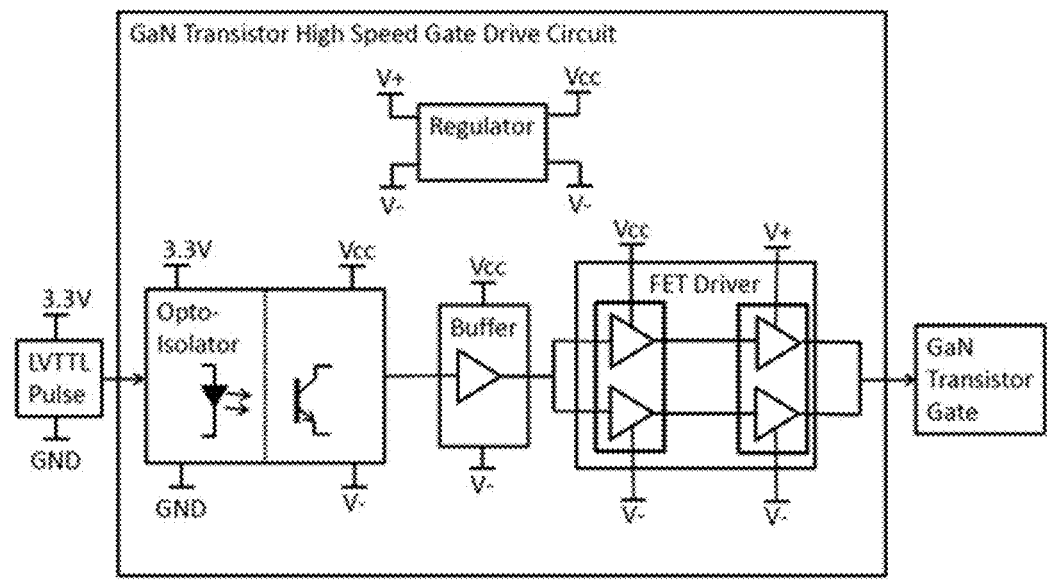
FIGS. 14A and 14B illustrates another LiDAR apparatus which is also in accordance with the present teaching

To implement the circuit the gate of the transistor needs to be driven at positive and negative biases in order to obtain maximum switching speed. In a practical system there would be a need to derive the transistor drive signals from a logical pulse output such as LVTTL or LVCMOS for example. FIG. 14(a) shows a block diagram of a circuit realization for translating a logical pulse to the gate drive signal. V+ and V− are of the order +6V and −6V respectively for the GS66502B chosen but could be varied depending on the Vgs specification of the GaN transistor. A regulator is used to provide a Vcc power supply relative to the V− rail. Vcc would typically sit 3.3V to 5V above the V− rail. The opto-isolator allows the logical input pulse to be translated to a pulse going from V− to Vcc. The opto-isolator output is then buffered before the FET driver block which again translates the V− to Vcc clock pulse to a gate drive pulse from V− to V+. The FET driver block has the ability to drive the GaN transistor gate at high speed ganging together the dual channels to achieve maximum drive capability. The opto-isolator used was the TLP117(F) and the output of this was buffered by a NC7WZ14P6X dual inverter with both outputs joined together. The ISL5510IVZ was then used to drive the transistor gate.

Figure 14B:
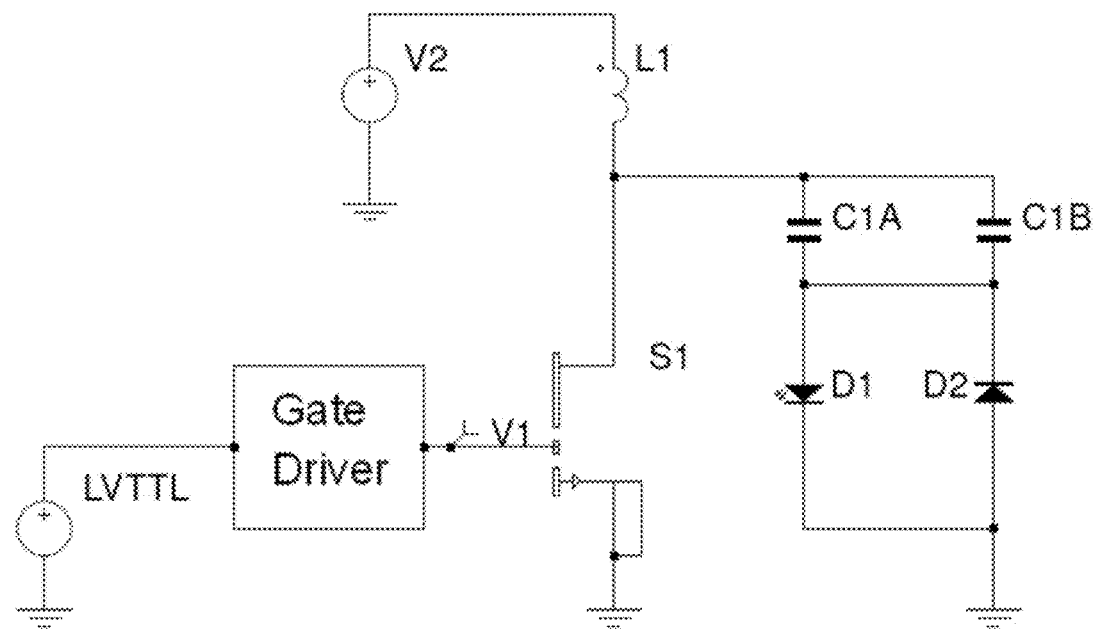

The circuit shown in FIG. 14(b) was used as a prototype of a pulsed laser driver with high peak power and narrow pulse width suitable for use in LiDAR Time of Flight (ToF) range finding systems. Two capacitors in parallel are used for C1 in order to reduce the inductance of the fast pulse path to the laser diode.

Figure 15:
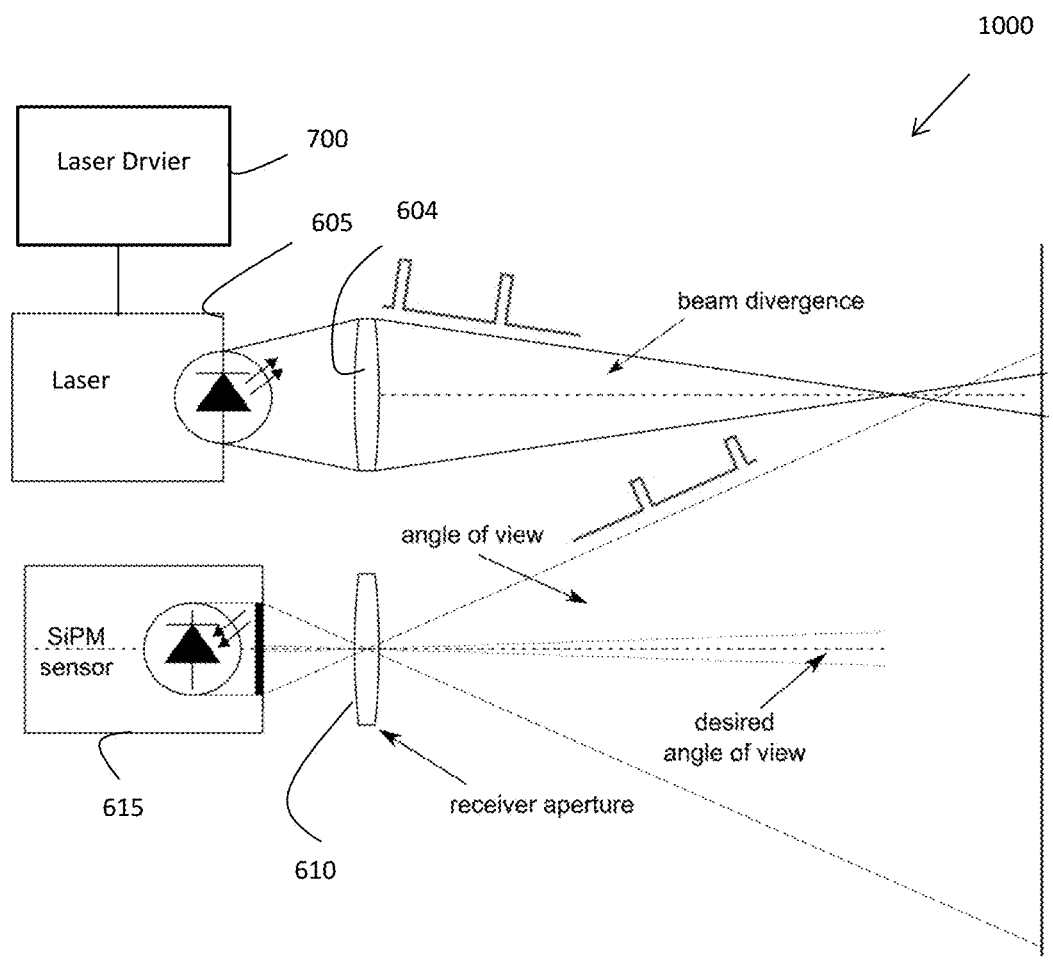
FIG. 15 illustrates a further LiDAR apparatus which is also in accordance with the present teaching.

Referring to FIG. 15 which illustrates another LiDAR apparatus 1000 which is also in accordance with the present teaching. The LiDAR apparatus 1000 includes a laser driver 700 as described with reference to FIG. 7 and a LiDAR device 300 as described with reference to FIG. 4. It will be appreciated that the laser driver 700 provides a short pulse laser driver current for driving the laser 305. The optical detector used in the LiDAR apparatus 1000 is an SiPM sensor 315 which operates in a manner as described with reference to FIGS. 5 and 6.

Figure 16:
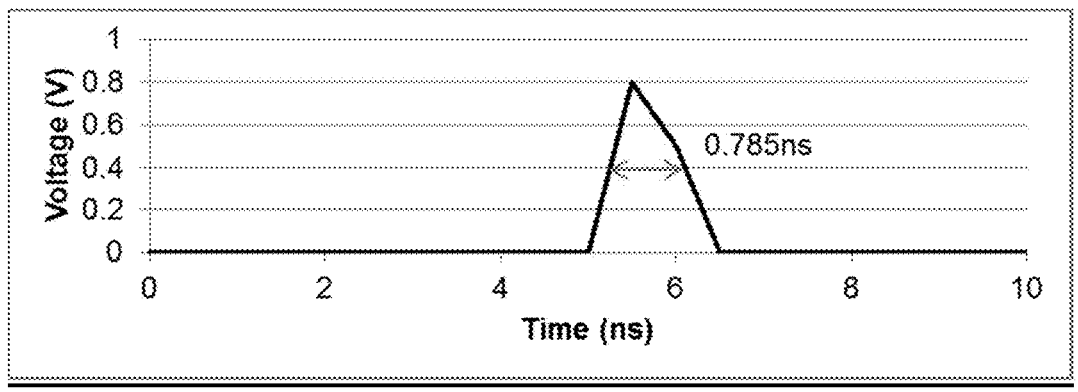
FIG. 16 illustrates an optical pulse shape from an OSRAM laser measured using a fast photodetector and oscilloscope.

Referring to FIG. 16 which illustrates an oscilloscope screenshot of the optical pulse obtained from the testing an OSRAM SPL PL90_3, 75 W, 905 nm, plastic packaged laser diode. The pulse shape was measured using Thorlabs DET08C/M—5 GHz InGaAs Free-Space Photodetector. The pulse repetition rate used was 100 KHz and the results show that a pulse with of 785 ps was achieved. A power meter was used to measure the average power and this revealed the peak power of the laser pulse to be approximately 35 W.

Figure 17:
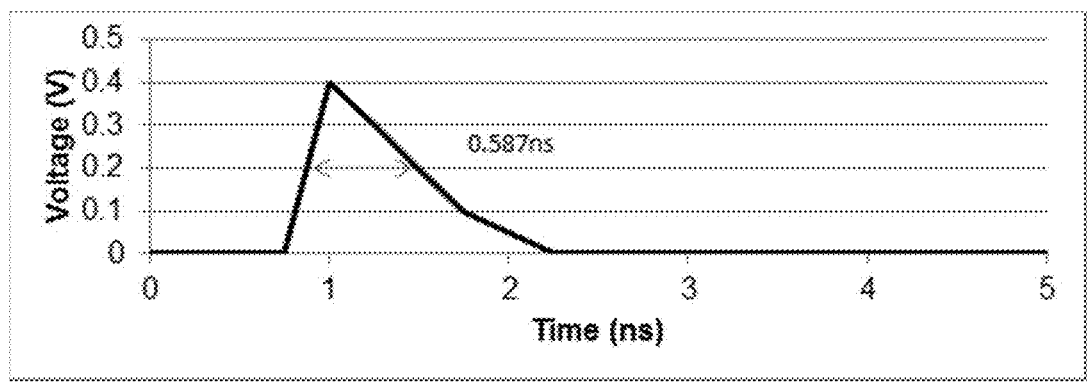
FIG. 17 illustrates an optical pulse shape from an Excelitas laser measured using a fast photodetector and oscilloscope.

A similar 905 nm laser is available from Excelitas but packaged in a surface mount package which decreases the inductance of the package pins. The pulse shape results for the Excelitas TPGAD1S09H 70 W SMD Laser are shown in FIG. 17 and it can be seen that the pulse width changes to 587 ps and the peak power was measured to be approximately 90 W. This demonstrates the advantage of minimizing the laser package inductance and how this is taken advantage of in the invention.

Many parameters can be adjusted to vary the peak power and optical pulse width, L1, C1, width of the gate drive pulse, gate bias voltages V+/V− and the coil bias V2 being the main ones. The simulations can be used as a guide for obtaining the required peak power and pulse with although the width of the current pulse may not directly correspond to the optical pulse width.

Figure 18:
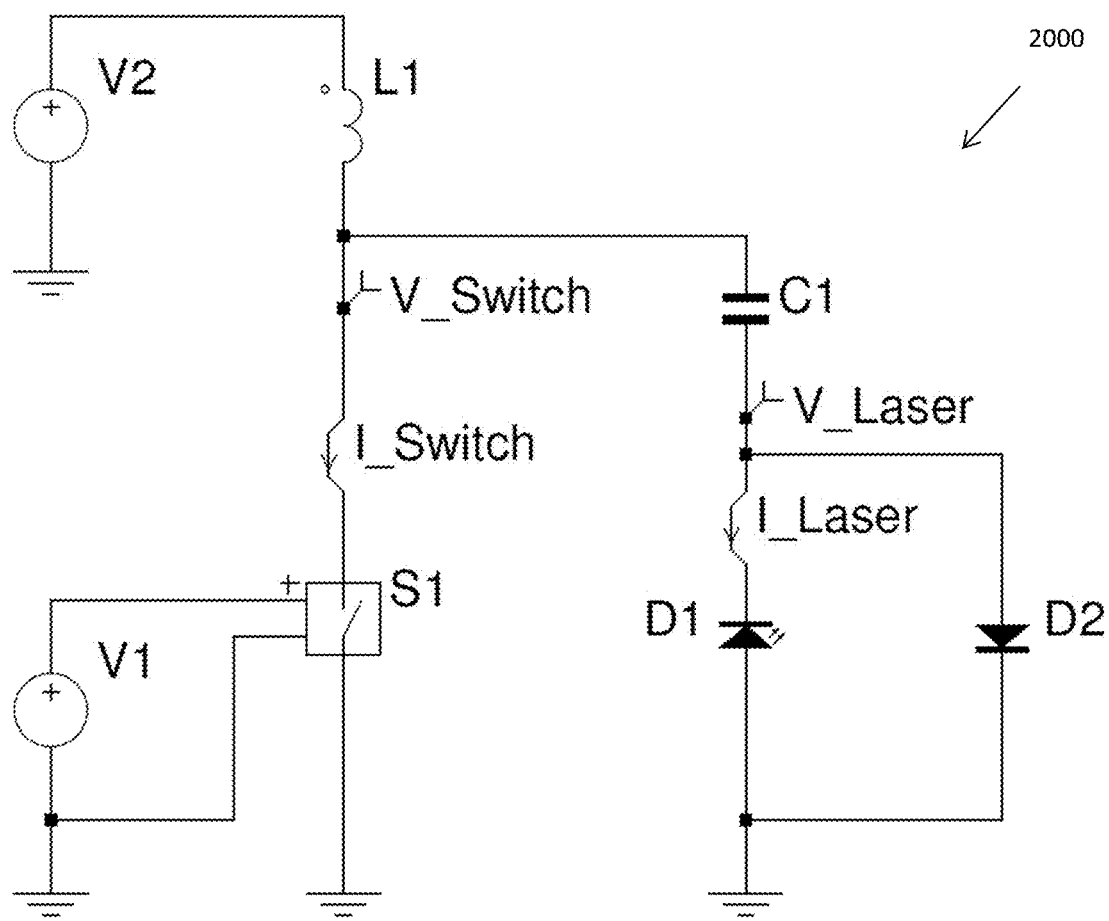
FIG. 18 illustrates a further LiDAR apparatus which is also in accordance with the present teaching.

Referring to FIG. 18 there is illustrated another laser driver 2000 which is substantially similar to the laser driver 700 and like components are indicated by corresponding labels. The main differences is that in laser driver 2000 the polarity is reversed compared to laser driver 700. The bias voltage reference V2 is negative and polarity of diodes D1 and D2 are reversed. Otherwise the operation of laser driver 2000 operates in a similar fashion to laser driver 700.

In the exemplary embodiments described it will be appreciated that the laser driver 700 may comprise a resonant circuit having an inductor L1 and a DC blocking capacitor C1. A biasing voltage reference V2 may be operably coupled to the inductor L1. A controller which in the examplary embodiment includes a switch S1 is operable for controlling the resonant circuit for selectively connecting the inductor L1 between high and low impedance. The DC blocking capacitor C1 is operable for connecting to a laser diode D1. When the inductor L1 is connected to the high impedance at least one of terminals of the inductor L1 is connected to an open circuit. When the inductor L1 is connected to the low impedance at least one of terminals of L1 is shorted to ground. The controller may also include a transistor gate driver or other control circuitry and is configured to repetitively switch the inductor L1 between high and low impedance. In the exemplary arrangement, the inductor L1 has a value in the range of 1 nH to 50 nH and the DC blocking capacitor has a value in the range of 10 pF to 1 nF. It will be appreciated that these exemplary values are provided by way of example only and alternative values may used for the inductor L1 and the capacitor C2. The resonant circuit generates an induced laser driver current as result of back EMF voltage generated across L1 which is relayed to the laser diode D1 via the capacitor C1. The induced lased driver current is a pulse signal having a short pulse width. In one example, the width of each pulse of the pulse signal is less than or equal to 1 ns. In another example, the width of each pulse of the pulse signal is in the range of 100 ps to 2 ns. The controller may also include a control voltage reference V1 which is operable for selectively opening and closing the switch S1. The control voltage reference V1 is operable to provide a pulsed voltage reference. The biasing voltage reference V2 biases the inductor L1 with a voltage level in the range of 10V to 50V. The controller repetitively cycles the switch S1 between open and closed states. In one example, the time period of the open state in the cycle is ≥10 nanoseconds. In another example, the time period of the closed state in the cycle is 10 to 100 nanoseconds. In a further example, the time period of the open and closed states is substantially equal.

When the switch S1 is closed a DC current that was flowing through the inductor is unable to stop abruptly thereby generating a back EMF across the inductor L1 and an induced current generated by the back EMF is diverted through DC current blocking capacitor C1 and the laser diode D1. When the switch S1 is provided by a Gallium Nitride transistor the maximum value of the pulse signal used to drive the gate thereof corresponds to the maximum gate source voltage range of the Gallium Nitride transistor. In one example, the pulse signal is in the range of −6V to +6V. In a further example, the pulse signal is in the range of −9V to +9. The pulse signal has a short duty cycle of 10 ns to 100 ns at 10 KHz to 200 MHz. The maximum reverse gate source voltage of the transistor corresponds to a Gate Source junction value when the transistor is driven into depletion causing the drain source current to turn off abruptly. Energy stored on the inductor L1 then gets passed as a sharp current pulse through the DC blocking capacitor C1 and delivered to the laser diode D1.

Figure 19:
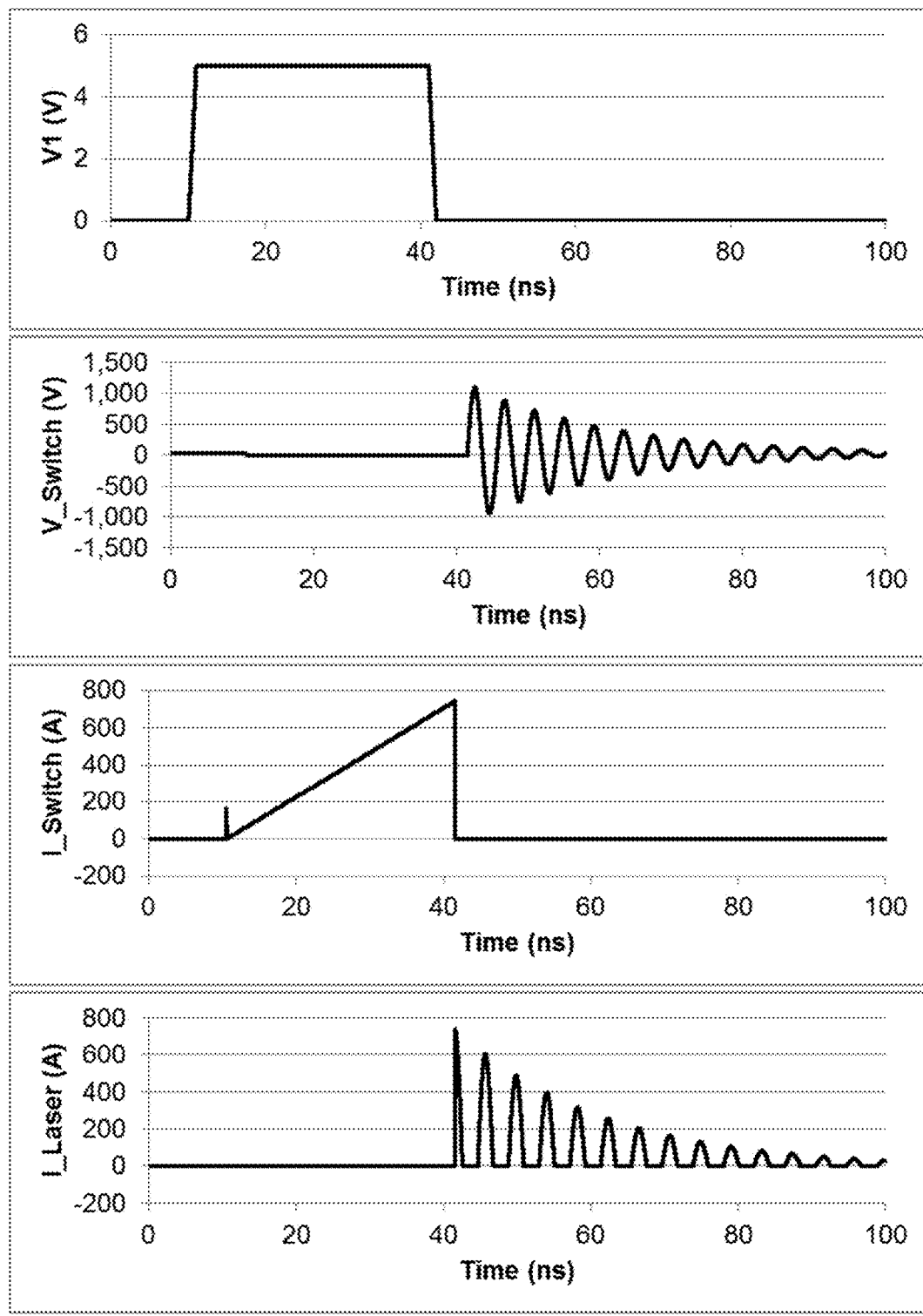
FIG. 19 illustrates timing diagrams using the laser driver of FIG. 7 with L1 having a value of 1 nH and C1 having a value of 440 pF.
Figure 20:
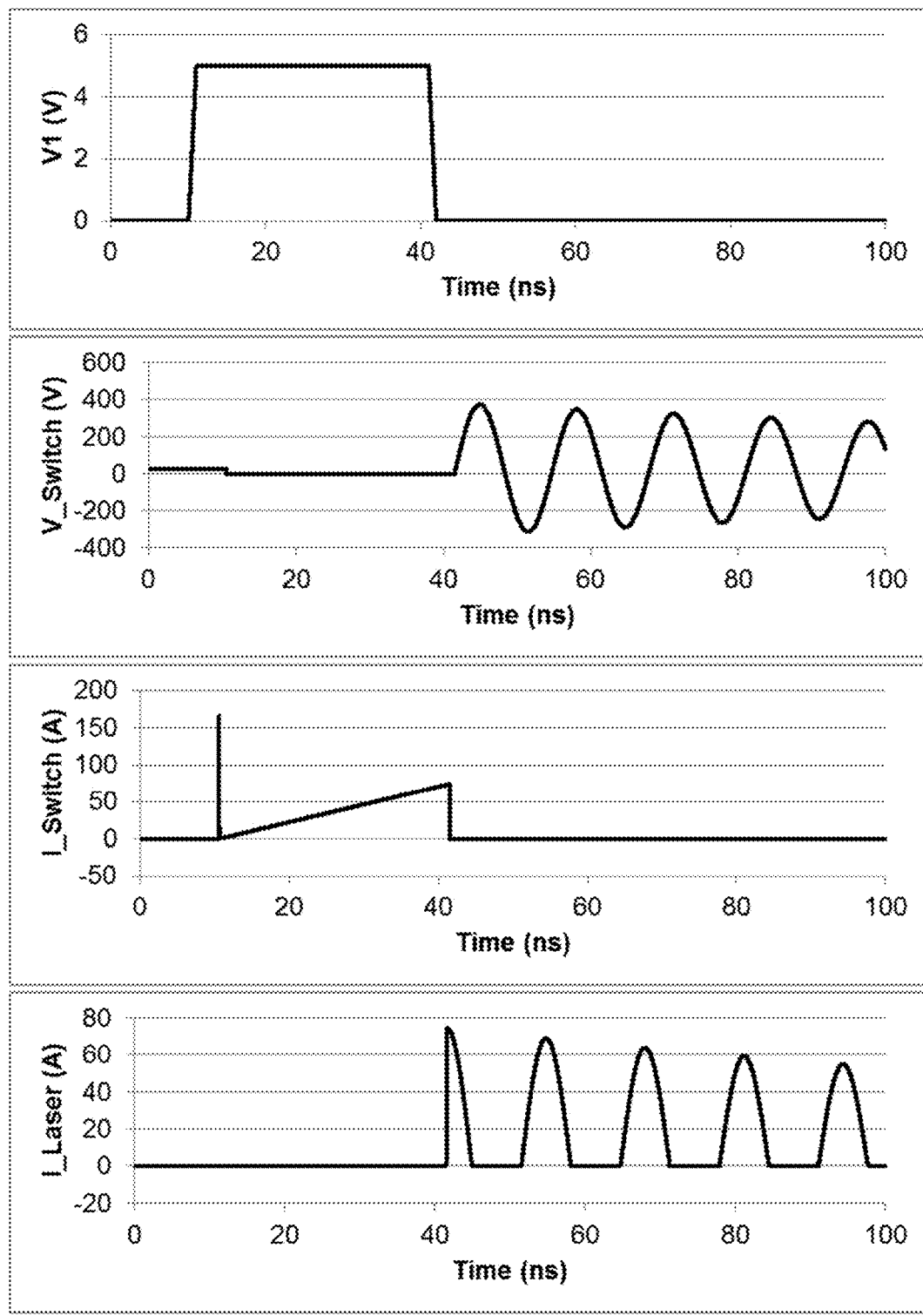
FIG. 20 illustrates timing diagrams using the laser driver of FIG. 7 with L1 having a value of 10 nH and C1 having a value of 440 pF.
Figure 21:
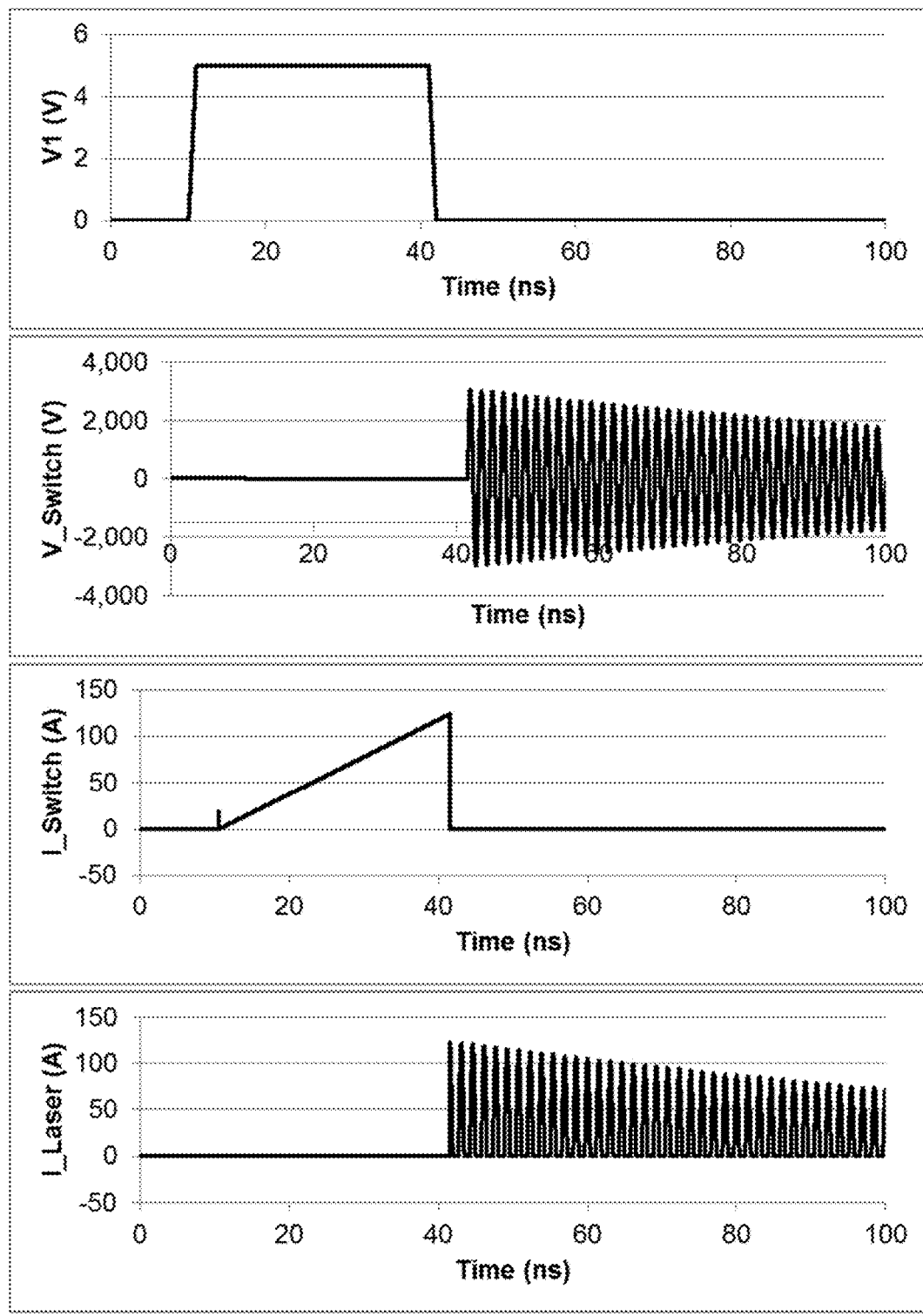
FIG. 21 illustrates timing diagrams using the laser driver of FIG. 7 with L1 having a value of 6 nH and C1 having a value of 10 pF.
Figure 22:
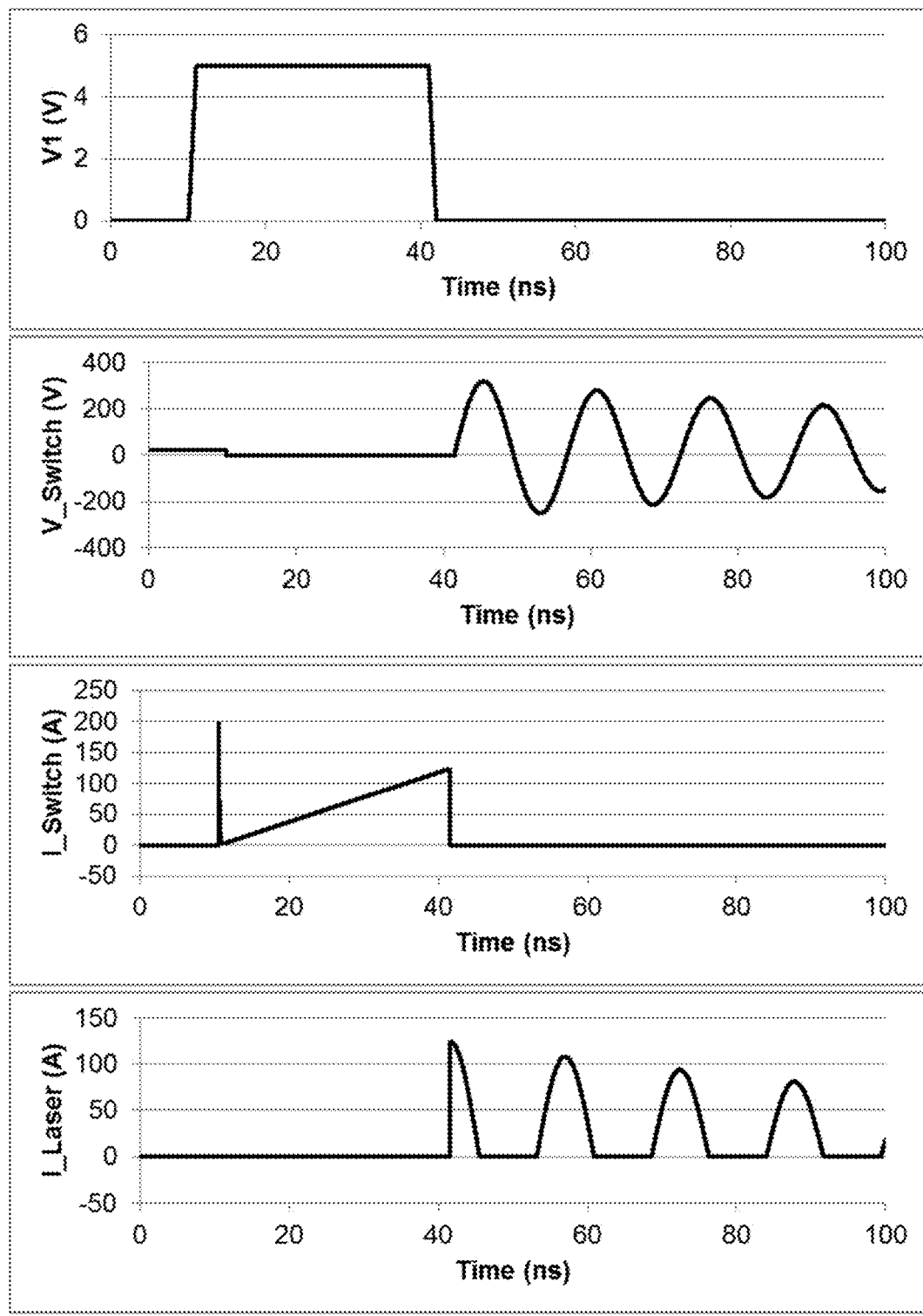
FIG. 22 illustrates timing diagrams using the laser driver of FIG. 7 with L1 having a value of 6 nH and C1 having a value of 1000 pF.
Figure 23:
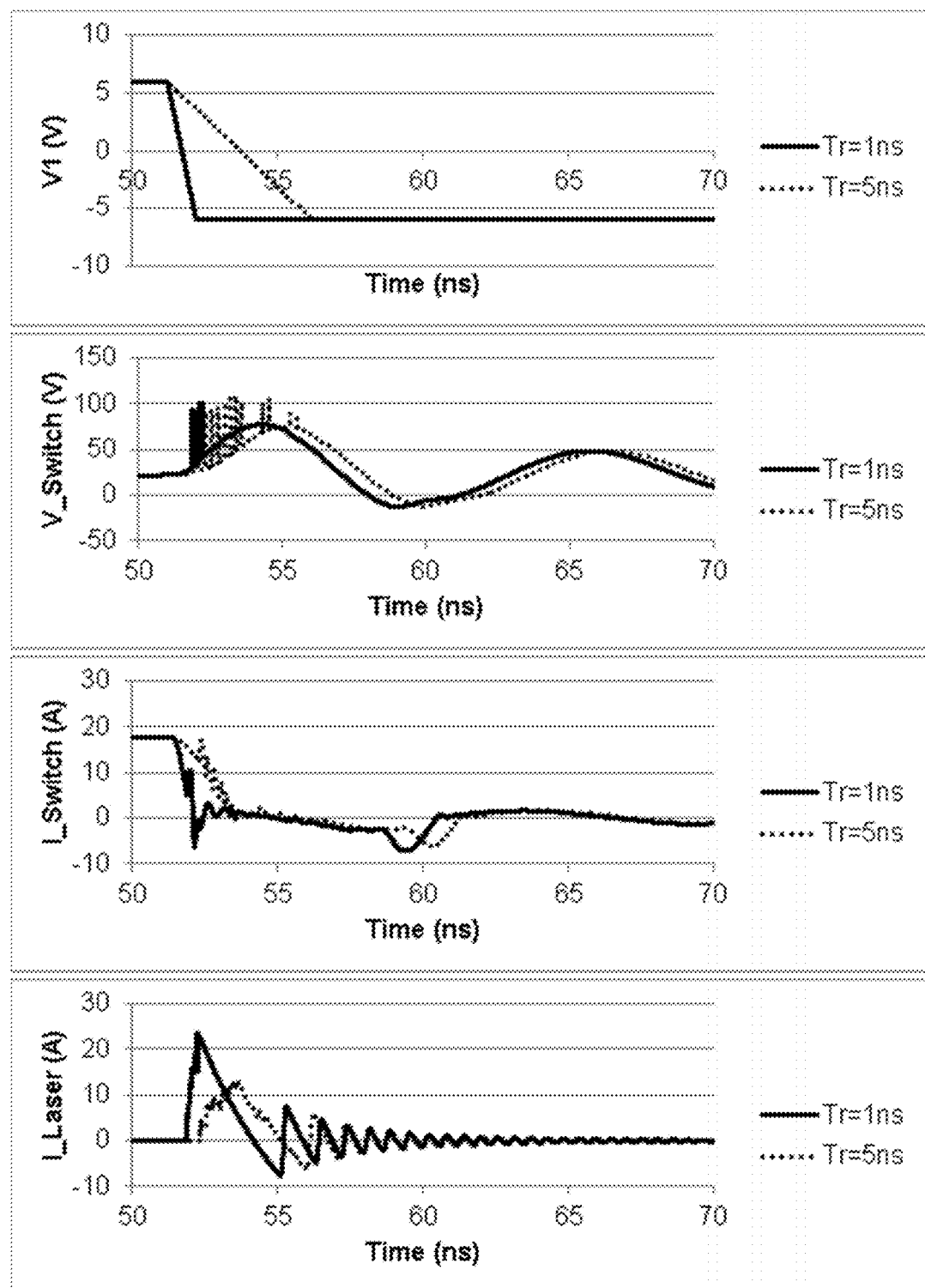
FIG. 23 illustrates the effect of slowing the switching of the GaN transistor from the circuit configuration in FIG. 11.

It will be appreciated that the graphs of FIGS. 19 to 22 graphically shows the effect of changing the values of the inductor L1 and the capacitor C1. FIG. 19 illustrates timing diagrams using the laser driver of FIG. 7 with L1 having a value of 1 nH and C1 having a value of 440 pF. FIG. 20 illustrates timing diagrams using the laser driver of FIG. 7 with L1 having a value of 10 nH and C1 having a value of 440 pF. FIG. 21 illustrates timing diagrams using the laser driver of FIG. 7 with L1 having a value of 6 nH and C1 having a value of 10 pF. FIG. 22 illustrates timing diagrams using the laser driver of FIG. 7 with L1 having a value of 6 nH and C1 having a value of 1000 pF. The total laser drive current pulse width is approximately a quarter of a cycle at the resonant frequency. FIG. 23 illustrates the effect of slowing the switching of the GaN transistor from the circuit configuration in FIG. 11. The switching speed of the GaN is controlled by varying the fall time of V1 from 1 to 5 ns. The time it takes for the current to reduce through the switch I_Switch increases when the fall time is increased and there is a phase delay in the Voltage across the switch V_Switch. The net effect on the laser current I_Laser is to decrease the peak current by a factor of two subsequently reducing the peak optical power output.

It will be appreciated by the person of skill in the art that various modifications may be made to the above described embodiments without departing from the scope of the present invention. In particular, it will be appreciated that the graphs of FIG. 8, FIGS. 10-13, FIGS. 16-17 and FIGS. 19-23 are provided by way of example only and it is not intended to limit the present teaching to the exemplary data contained in these graphs which are provided by way of example only. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

What is claimed is:

1. A laser driver comprising:
   a resonant circuit having an inductor and a DC blocking capacitor;
   a biasing voltage reference operably coupled to the inductor;
   and a controller operable for controlling the resonant circuit for selectively connecting the inductor to ground; wherein the DC blocking capacitor is operable for connecting to a laser diode,
   wherein the controller comprises a switch such that when the switch is closed, a path is provided from the inductor to ground, and when the switch is open, the path to ground is isolated from the inductor; and
   wherein the switch comprises a Gallium Nitride transistor.

2. A laser driver as claimed in claim 1; wherein when the inductor is connected to the high impedance at least one of terminals of the inductor is connected to an open circuit.

3. A laser driver as claimed in claim 1; wherein when the inductor is connected to the low impedance at least one of terminals is shorted to ground.

4. A laser driver as claimed in claim 1; wherein the controller is configured to repetitively switch the inductor between high and low impedance.

5. A laser driver as claimed in claim 4; wherein the inductor has a value in the range of 1 nH to 50 nH.

6. A laser driver as claimed in claim 5; wherein the DC blocking capacitor has a value in the range of 10 pF to 1 nF.

7. A laser driver as claimed in claim 4; wherein an induced laser driver current is generated by the resonant circuit.

8. A laser driver as claimed in claim 7; wherein the induced laser driver current is a pulse signal.

9. A laser driver as claimed in claimed claim 8; wherein the width of each pulse of the pulse signal is less than or equal to 1 ns.

10. A laser driver as claimed in claim 8; wherein the width of each pulse of the pulse signal is in the range of 100 ps to 2 ns.

11. A laser driver as claimed in claim 1; wherein the DC blocking capacitor is operable for connecting to an anode of the laser diode.

12. A laser driver as claimed in claim 11; wherein a cathode of the laser diode is operably coupled to ground.

13. A laser driver as claimed in claim 1; wherein the DC blocking capacitor is operable for connecting to a cathode of the laser diode.

14. A laser driver as claimed in claim 11; wherein the anode of the laser diode is operably coupled to ground.

15. A laser driver as claimed in claim 11; wherein the biasing voltage reference is operable to provide a positive bias voltage.

16. A laser driver as claimed in claim 15; wherein the positive bias voltage is in the range of 10 V to 50 V.

17. A laser driver as claimed in claim 14; wherein the biasing voltage reference is operable to provide a negative bias voltage.

18. A laser driver as claimed in claim 1; further comprising a control voltage reference which is operable for selectively opening and closing the switch.

19. A laser driver as claimed in claim 18; wherein the control voltage reference is operable to provide a pulsed voltage reference.

20. A laser driver as claimed in claim 1; wherein the biasing voltage reference biases the inductor with a voltage level in the range of 10 V to 50 V.

21. A laser driver as claimed in claim 1; wherein an induced EMF voltage is generated across the inductor.

22. A laser driver as claimed in claim 21; wherein the induced EMF voltage opposes the biasing voltage reference until a steady state DC voltage value is reached.

23. A laser driver as claimed in claim 1; wherein the controller repetitively cycles the switch between open and closed states.

24. A laser driver as claimed in claim 23; wherein the time period of the open state in the cycle is ≥10 nanoseconds.

25. A laser driver as claimed in claim 24; wherein the time period of the closed state in the cycle is 10 to 100 nanoseconds.

26. A laser driver as claimed in claim 25; wherein the time period of the open and closed states is substantially equal.

27. A laser driver as claimed in claim 1; wherein the controller is configured to apply a pulsed drive signal to the switch for controlling thereof.

28. A laser driver as claimed in claim 1; wherein when the switch is closed a DC current that was flowing through the inductor is unable to stop abruptly thereby generating a back EMF across the inductor and an induced current generated by the back EMF is diverted through DC current blocking capacitor C1 and the laser diode.

29. A laser driver as claimed in claim 1; wherein the resonant circuit resonates at a frequency $1/(2\pi(LC)^{1/2})$ which determines a pulse width of the induced current pulse injected into the laser driver.

30. A laser driver as claimed in claim 29; wherein the pulse width of the induced current is tuned by appropriate selection of the inductor and DC blocking capacitor values.

31. A laser driver as claimed in claim 1; further comprising a protection diode operable for protecting the laser diode against reverse polarity when the resonant circuit is resonating.

32. A laser driver as claimed in claim 1; wherein the controller comprises a MOSFET driver.

33. A laser driver as claimed in claim 32; wherein the MOSFET driver is operable to drive the Gallium Nitride transistor with a pulse signal having positive and negative components.

34. A laser driver as claimed in claim 33; wherein the maximum value of the pulse signal corresponds to the maximum gate source voltage range of the Gallium Nitride transistor.

35. A laser driver as claimed in claim 33; wherein the pulse signal is in the range of −6V to +6V.

36. A laser driver as claimed in claim 33; wherein the pulse signal has a duty cycle of 0.1% or less.

37. A laser driver as claimed in claim 36; wherein the pulse signal has a pulse width of 100 ns or less.

38. A laser driver as claimed in claim 1; wherein the maximum reverse gate source voltage of the transistor corresponds to a Gate Source junction value when the transistor is driven into depletion causing the drain source current to turn off abruptly.

39. A LiDAR device comprising:
a laser driver as claimed in claim 1;
a laser operably coupled to the laser driver; and
an optical detector.

40. A LiDAR device as claimed in claim 39; wherein the optical detector comprises a Geiger mode detector.

41. A LiDAR device as claimed in claim 39; wherein the optical detector comprises a SiPM detector.

42. A LiDAR device as claimed in claim 39; wherein the optical detector comprises a single photon avalanche diode (SPAD).

* * * * *